United States Patent
Ishimine

(10) Patent No.: US 6,618,251 B2
(45) Date of Patent: Sep. 9, 2003

(54) COOLING DEVICE CAPABLE OF CONTACTING TARGET WITH SMALLER URGING FORCE

(75) Inventor: Junichi Ishimine, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/073,005

(22) Filed: Feb. 12, 2002

(65) Prior Publication Data

US 2003/0067746 A1 Apr. 10, 2003

(30) Foreign Application Priority Data

Oct. 9, 2001 (JP) ........................................ 2001-312044

(51) Int. Cl.$^7$ ................................................ H05H 7/20
(52) U.S. Cl. ..................... 361/704; 165/80.2; 165/80.3; 165/185; 174/16.3; 257/707; 257/712; 257/718; 361/708; 361/719; 361/690
(58) Field of Search .................. 165/80.2, 80.3, 165/185; 174/16.3; 257/706–707, 712–713, 718–719, 726–727; 361/706–710, 719–721, 690

(56) References Cited

U.S. PATENT DOCUMENTS

| | | | | |
|---|---|---|---|---|
| 3,904,262 | A | * 9/1975 | Cutchaw | ...................... 361/704 |
| 5,313,099 | A | 5/1994 | Tata et al. | |
| 5,883,783 | A | * 3/1999 | Turturro | ...................... 361/704 |
| 6,297,961 | B1 | 10/2001 | Koizumi et al. | |

FOREIGN PATENT DOCUMENTS

| | | |
|---|---|---|
| JP | 63-3443 | 1/1988 |
| JP | 10-29687 | 2/1998 |
| JP | 2000-22059 | 1/2000 |
| JP | 2000-150736 | 5/2000 |

OTHER PUBLICATIONS

IBM Tech Disc Bulletin "Heatsink Attachment for Improved Electro–Magnetic Compatibiility and Shock Performance", vol. 38, No.03,3/1985,pp.383–385.*

* cited by examiner

*Primary Examiner*—Gregory Thompson
(74) *Attorney, Agent, or Firm*—Armstrong, Westerman & Hattori, LLP

(57) ABSTRACT

A heat conductive fluid is interposed between an electronic component and a heat sink. The heat conductive fluid serves to enhance the contact between the surface of the electronic component and the opposed surface of the heat sink. The heat conductive fluid also exhibits the property of adsorption between a pair of surfaces based on the fluidity of the heat conductive fluid itself. Although the adsorption allows the slippage of the heat sink along the surface of the electronic component, the adsorption reliably restrains the heat sink from moving in the perpendicular direction perpendicular to the surface of the electronic component. The atmospheric pressure solely acts on the heat sink so as to urge the heat sink against the surface of the electronic component. No excessive urging force is applied to the electronic component. Since the slippage of the heat sink is restrained, the heat conductive fluid can be maintained enough between the heat sink and the electronic component over an enough extent, irrespective of inclination of the surface or vibration of the electronic component. The heat conductive fluid keeps the adsorption acting between the surface of the electronic component and the opposed surface of the heat sink.

20 Claims, 8 Drawing Sheets

COOLING DEVICE CAPABLE OF CONTACTING TARGET WITH SMALLER URGING FORCE

BACKGROUND OF THE INVENTION

1. Field of the Invention

The present invention relates to a cooling device utilizing a heat radiation member, such as a heat sink, so as to promote heat radiation from a target member such as an electronic component.

2. Description of the Prior Art

As disclosed in Japanese Patent Publication P2000-22059A, a heat sink is conventionally utilized to cool an electronic component mounted on a printed circuit board, for example. When the heat sink is received on the electronic component, a flat opposed surface of the heat sink is allowed to contact the upper surface of the electronic component. The heat sink should contact the upper surface of the electronic component over a larger area. The heat sink is thus urged against the upper surface of the electronic component. A biasing force from a spring is, for example, utilized to urge the heat sink against the electronic component.

If the heat sink is excessively urged against the electronic component, a larger stress is induced within the electronic component. Continuous application of the excessive urging force may cause deformation of the electronic component. Prevention of the stress or deformation in the electronic component is supposed to contribute to a reliable electric connection between the electronic component and the printed circuit board as well as a longer lifetime of the electronic component and the printed circuit board. It is preferable to reduce to the utmost any external force acting on the electronic component.

SUMMARY OF THE INVENTION

It is accordingly an object of the present invention to provide a cooling device capable of keep contacting a heat radiation member on the surface of a target member over a larger area with the smallest urging force.

According to a first aspect of the present invention, there is provided a cooling device comprising: a heat radiation member received on the surface of a target member at the opposed surface of the heat radiation member; a heat conductive fluid interposed between the surface of the target member and the opposed surface of the heat radiation member; and a slippage prevention mechanism restraining slippage of the heat radiation member along the surface of the target member.

In addition, according to a second aspect of the present invention, there is provided a cooling device comprising: a heat conductive fluid spreading over the surface of a target member; a heat radiation member disposed on the heat conductive fluid and urged against the surface of the target member with the atmospheric pressure; and a slippage prevention mechanism restraining slippage of the heat radiation member along the surface of the target member.

The heat conductive fluid serves to enhance the contact between the surface of the target member and the opposed surface of the heat radiation member. Even if a larger roughness or rough flatness is established on the surface of the target member or/and the opposed surface of the heat radiation member, the heat radiation member is allowed to contact the target member uniformly over a larger area. A higher heat conductivity can thus be established between the target member and the heat radiation member. Heat of the target member is efficiently transferred to the heat radiation member. Heat radiation from the heat radiation member can be promoted.

Moreover, the heat conductive fluid exhibits a property of adsorption between a pair of surfaces based on the fluidity of the heat conductive fluid itself. Although the adsorption allows the slippage of the heat radiation member along the surface of the target member, the adsorption reliably restrains the heat radiation member from moving in the perpendicular direction perpendicular to the surface of the target member. Specifically, the heat conductive fluid serves to prevent the heat radiation member from peeling off from the target member.

On the other hand, the slippage prevention mechanism serves to restrain slippage of the heat radiation member. The relative movement of the heat radiation member can be restrained along the surface of the target member, irrespective of inclination of the surface or vibration of the target member. The heat conductive fluid can be maintained enough between the heat radiation member and the target member over an enough extent irrespective of the slippage of the heat radiation member. The heat conductive fluid keeps the adsorption acting between the surface of the target member and the opposed surface of the heat radiation member.

In the above-described cooling device, as long as the slippage of the heat radiation member is restrained within a predetermined range, the heat conductive fluid solely serves to keep the heat radiation member on the surface of the target member. The atmospheric pressure solely acts on the heat radiation member so as to urge the heat radiation member against the surface of the target member. No excessive urging force may be applied to the target member.

The slippage prevention mechanism may preferably comprise a frame member surrounding the target member and the heat radiation member. The frame member should be designed to move relative to the target member and the heat radiation member along the perpendicular direction perpendicular to the surface of the target member. The frame member of this type can easily be attached to and detached from the heat radiation member. When the frame member is removed, the heat radiation member may be allowed to slip along the surface of the target member. The heat radiation member is easily allowed to take off from the target member in this manner. This leads to an easier detachment of the heat radiation member from the target member.

Alternatively, the slippage prevention mechanism may include a protrusion formed on the target member so as to engage the heat radiation member when the heat radiation member slips along the surface of the target member, or a protrusion formed on the heat radiation member so as to engage the target member when the heat radiation member slips along the surface of the target member. Otherwise, the cooling device may further include, in place of the aforementioned protrusions, a support member fixedly supporting the target member, and a protrusion fixedly located on the support member and engaging the heat radiation member when the heat radiation member slips along the surface of the target member.

The heat conductive fluid may include at least either of ceramic particles or metallic particles, as a filler, so as to establish the property of heat conductivity. Since the ceramic and metallic particles have a higher heat conductivity, the fluid is allowed to have a higher heat conductivity.

The heat conductive fluid may include a silicone grease as a solvent, for example. The silicone grease may keep its fluidity for a longer period of time irrespective of variation in temperature. Even if the target member gets heated, the fluidity of the heat conductive fluid can be maintained for a longer period of time. The heat radiation member can reliably be held on the target member for a longer time of period.

The aforementioned slippage prevention mechanism may allow the slippage of the heat radiation member along the surface of the target member within a regulated extent. In general, when the target member gets heated, a relative displacement is generated between the surface of the target member and the opposed surface of the heat radiation member in the lateral direction based on the difference in thermal expansion. The heat conductive fluid easily absorbs the relative displacement based on the fluidity itself. Moreover, since spaces are defined to allow the slippage of the heat radiation member within the regulated extent in the slippage prevention mechanism, the target member, the heat radiation member and the slippage prevention mechanism are reliably prevented from generation of internal stresses even if the target member and/or the heat radiation member thermally expand.

The heat radiation member may be a heat sink, for example. The heat sink may include a heat receiving plate received on the surface of the target member, and fins standing on the heat receiving plate in the vertical direction. The cooling device of this type may be utilized to cool an electronic component mounted on a printed wiring board or substrate.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
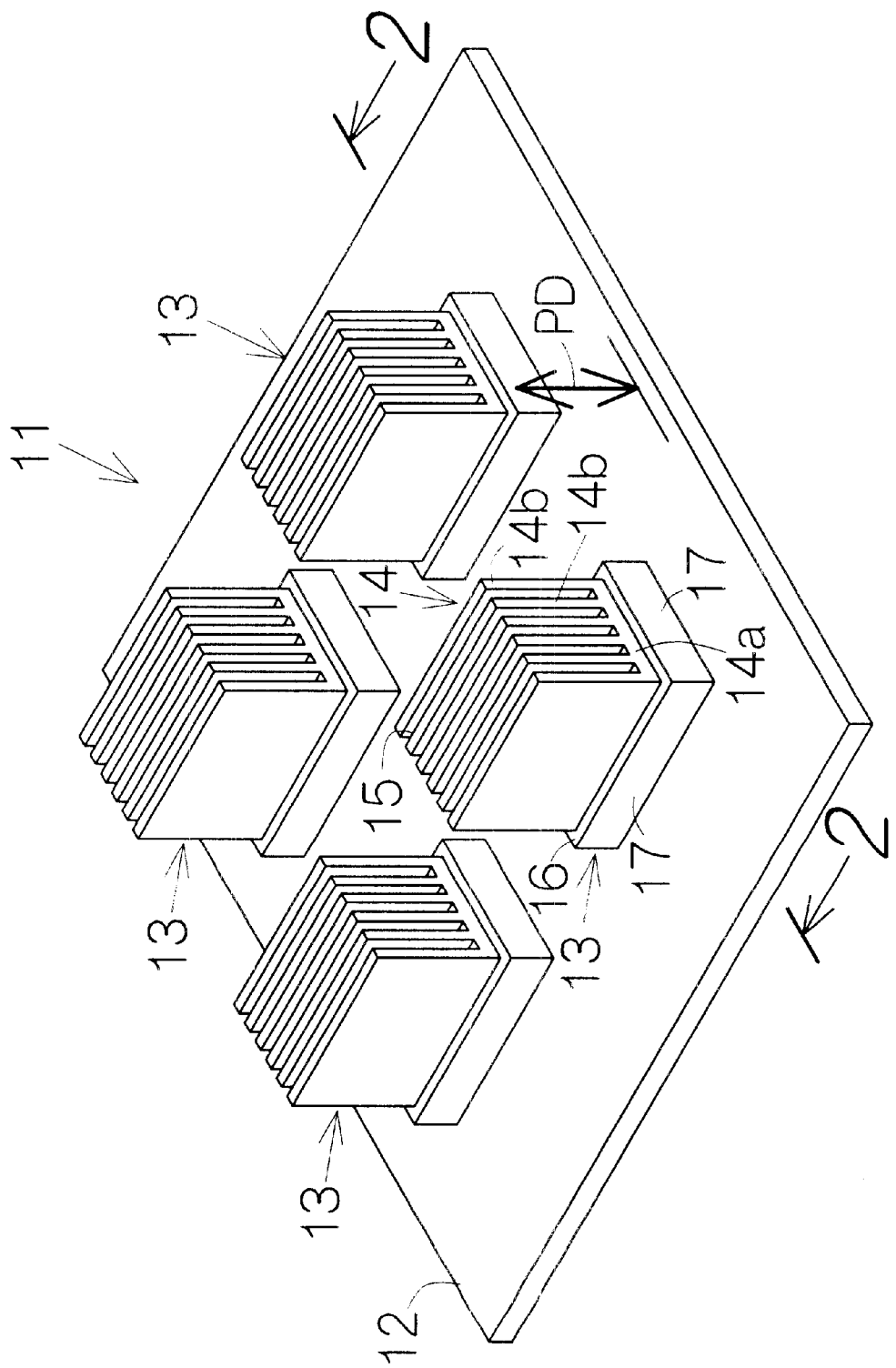
FIG. 1 is a perspective view of an electronic circuit board for schematically illustrating the appearance of a cooling device according to a first embodiment of the present invention.

FIG. 1 schematically illustrates an electronic circuit board 11. The electronic circuit board 11 includes a printed wiring board or substrate 12 made of a resin material, for example, for receiving one or more electronic components on the surface, as described later in detail. An electrically conductive wiring pattern, not shown, spreads over the surface or/and interior of the printed wiring board 12 so as to establish electric connections between the electronic components, for example. The electronic circuit board 11 of this type may be incorporated in a computer system such as a server computer, for example.

Cooling devices 13 according to a first embodiment of the present invention are mounted on the upper surface of the printed wiring board 12. The individual cooling device 13 includes a heat radiation member or heat sink 14. The heat sink 14 may comprise a heat receiving plate 14a and a plurality of fins 14b standing upright from the heat receiving plate 14b. Ventilation passages 15 are defined between the adjacent fins 14b so as to extend in parallel in a specific direction. When the electronic circuit board 11 is incorporated in a server computer, for example, a blower unit may be utilized to generate airflow passing through the individual ventilation passages 15. The heat sink 14 may be made of a metallic material such as aluminum, copper, or the like.

The cooling device 13 further includes a frame member 16 surrounding the heat receiving plate 14a of the heat sink 14 along the surface of the printed wiring board 12. Four walls 17 are defined in the frame member 16 so as to stand upright from the surface of the printed wiring board 12. The walls 17 are continuously opposed to the periphery of the heat receiving plate 14a. The frame member 16 is set around the heat sink 14 for a relative movement in the perpendicular direction PD perpendicular to the surface of the printed wiring board 12. The frame member 16 may be molded out of a resin material, for example.

Figure 2:
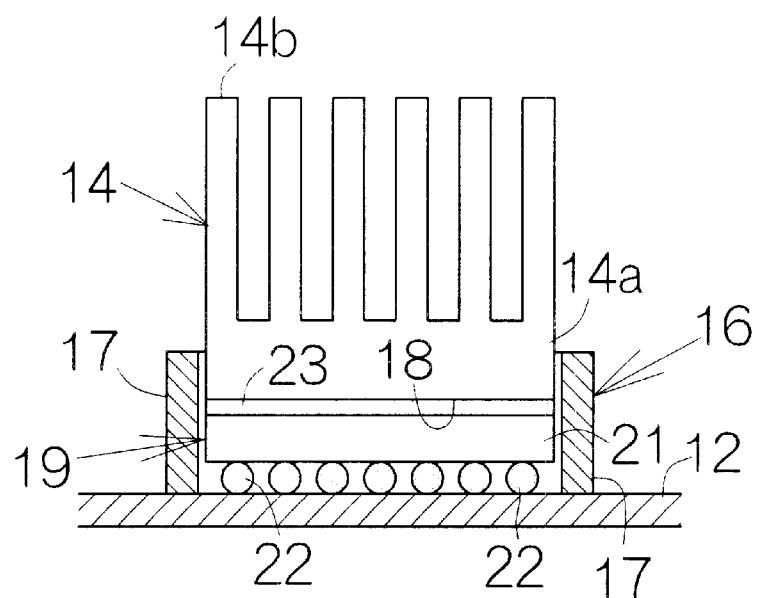
FIG. 2 is an enlarged partial sectional view taken along the line 2—2 in FIG. 1.

As shown in FIG. 2, the heat receiving plate 14a of the heat sink 14 is stacked on a target, namely, the electronic component 19. The flat opposed surface 18 of the heat sink 14 is received on the upper surface of the electronic component 19. Here, the electronic component 19 may be a ball grid array (BGA) semiconductor package, for example. A semiconductor chip, not shown, is mounted on the upper surface of a small-sized ceramic substrate 21 in the BGA semiconductor package. A plurality of terminal bumps 22 are attached to the lower surface of the small-sized ceramic substrate 21. The terminal bumps 22 are received on the corresponding terminal pads, not shown, on the printed wiring board 12. In this manner, electric connection can be established between the electronic component 19 or BGA semiconductor package and the printed wiring board 12. The terminal bumps 22 may be made of an electrically conductive material such as a solder material, for example. An underfill may be interposed between the small-sized ceramic substrate 21 and the printed wiring board 12. The electronic component 19 may take any other form.

A heat conductive fluid or thermal grease 23 is interposed between the surface of the electronic component 19 and the opposed surface 18 of the heat sink 14. The thermal grease 23 comprises a silicone grease and a heat conductive filler dispersed in the silicone grease. The heat conductive filler may be ceramic particles or metallic particles, for example.

The thermal grease 23 serves to enhance the contact between the electronic component 19 and the heat sink 14. Even if a larger roughness is established on the surface of the electronic component 19 or/and the opposed surface 18 of the heat sink 14, the heat sink 14 is allowed to contact the electronic component 19 uniformly over a larger area. A higher heat conductivity can thus be established between the electronic component 19 and the heat sink 14. Heat of the electronic component 19 is efficiently transferred to the heat receiving plate 14a of the heat sink 14. Heat radiation from the heat sink 14 can be promoted.

In addition, the thermal grease 23 exhibits a property of adsorption between a pair of surfaces based on the fluidity of the silicone grease. Although the adsorption allows the slippage of the heat sink 14 along the surface of the electronic component 19, the adsorption reliably restrains the heat sink 14 from moving in the perpendicular direction PD perpendicular to the surface of the electronic component 19. Specifically, the thermal grease 23 serves to prevent the heat sink 14 from peeling off from the electronic component 19. Only the atmospheric pressure acts to urge the heat sink 14 against the surface of the electronic component 19 in this case.

As is apparent from FIG. 2, the frame member 16 is designed to surround the electronic component 19 along the surface of the printed wiring board 12. The walls 17 of the frame member 16 is opposed to the periphery of the electronic component 19 at all directions at positions spaced from the electronic component 19. During transportation of the printed wiring board 12, for example, the heat sink 14 may slip along the surface of the electronic component 19 because of inclination or vibration of the printed wiring board 12. The frame member 16 is allowed to move along the surface of the printed wiring board 12 so as to follow the movement of the heat sink 14. The inner surface of the wall 17 is thereafter received on the periphery of the electronic component 19. In this manner, the frame member 16 restrains the slippage of the heat sink 14 within a predetermined range. Specifically, the frame member 16 serves to maintain the thermal grease 23 between the heat sink 14 and the electronic component 19 over an enough extent irrespective of the slippage of the heat sink 14. The thermal grease 23 keeps the adsorption acting between the surface of the electronic component 19 and the opposed surface 18 of the heat sink 14. In particular, the electronic circuit board 11 is in general kept in a vertical or upright attitude in a server computer, for example. Even in this case, the frame member 16 reliably restrains the slippage of the heat sink 14 within a predetermined extent. The frame member 16 thus functions as a slippage prevention mechanism of the present invention.

As long as the slippage of the heat sink 14 is restrained in the cooling device 13 in the aforementioned manner, the thermal grease 23 solely serves to keep the heat sink 14 on the surface of the electronic component 19. The atmospheric pressure solely acts on the heat sink 14 so as to urge the heat sink 14 against the surface of the electronic component 19. No excessive urging force may be applied to the electronic component 19. An internal stress can be suppressed in the electronic component 19. The electronic component 19 is reliably prevented from deformation.

In general, when the electronic component 19 generates heat, a relative displacement is generated between the surface of the electronic component 19 and the opposed surface 18 of the heat sink 14 in the lateral direction based on the difference in thermal expansion. The thermal grease 23 easily absorbs the relative displacement based on the fluidity of the silicone grease. Moreover, even if the electronic component 19 and/or the heat sink 14 thermally expand, the electronic component 19, the heat sink 14 and the frame member 16 are reliably prevented from generation of internal stresses, since spaces are defined between the frame member 16 and the electronic component 19 as well as between the frame member 16 and the heat sink 14.

The silicone grease may keep its fluidity for a longer period of time irrespective of variation in temperature. Even if the electronic component 19 gets heated, the fluidity of the thermal grease 23 can be maintained for a longer period of time. The heat sink 14 can reliably be held on the electronic component 19 for a longer time of period.

Figure 3:
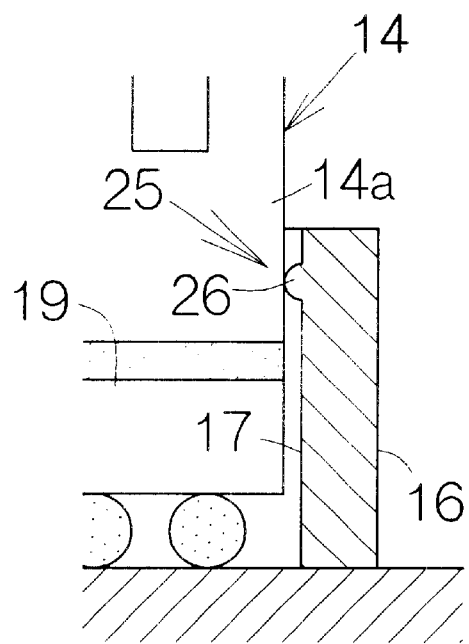
FIG. 3 is an enlarged vertical sectional view for schematically illustrating the structure of a displacement prevention mechanism.

As shown in FIG. 3, a displacement prevention mechanism 25 may be established between the frame member 16 and the heat sink 14. The displacement prevention mechanism 25 may comprise a protrusion 26 formed on the inner surface of the wall 17, for example. The protrusion 26 is forced to contact the periphery of the heat sink 14 so as to hold the frame member 16 on the heat sink 14 based on the elasticity of the frame member 16 made of a resin material, for example. In this case, the protrusion 26 may be employed in combination with a depression, not shown, formed on the heat sink 14. The depression may receive the protrusion 26 when the frame member 16 takes a predetermined set position. The frame member 16 at the predetermined set position should be designed to completely surround the heat sink 14 and the electronic component 19. Alternatively, the protrusion 26 may be formed on the heat sink 14. Otherwise, the displacement prevention mechanism 25 of this type may be established between the frame member 16 and the electronic component 19.

Figure 4:
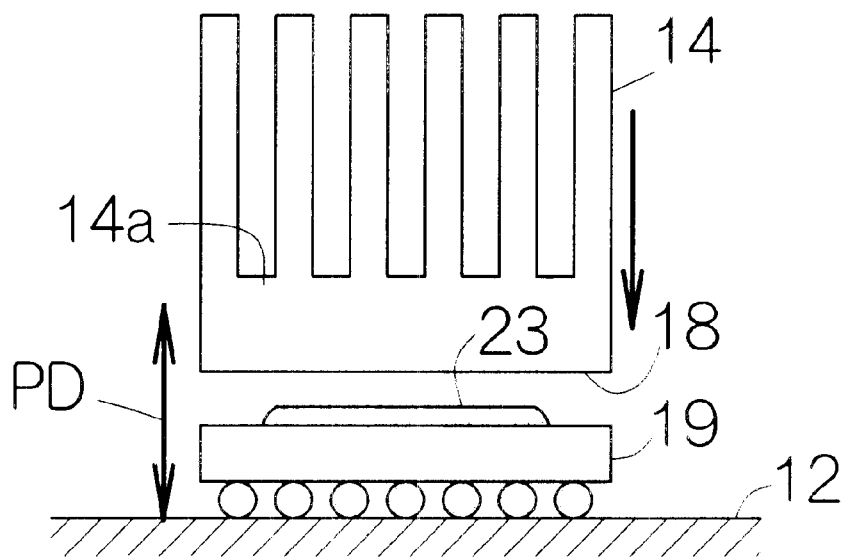
FIG. 4 is an enlarged partial vertical sectional view of a printed wiring board for schematically illustrating the process of mounting a heat sink on an electronic component.

Next, a brief description will be made on a method of attaching and detaching the cooling device 13 according to the first embodiment of the invention. As shown in FIG. 4, the printed wiring board 12 is kept in the horizontal attitude before setting the cooling device 13. The electronic component 19 is previously mounted on the surface of the printed wiring board 12. The thermal grease 23 is then supplied to the upper surface of the electronic component 19. If the upper surface of the electronic component 19 has a square or rectangular shape, the thermal grease 23 may be supplied to the central area and along the diagonals.

The heat sink 14 is then mounted on the surface of the electronic component 19. The heat receiving plate 14a may be formed into a shape corresponding to the contour of the electronic component 19. The heat sink 14 is then urged against the electronic component 19 on the printed wiring board 12 with a predetermined urging force. The thermal grease 23 is thus allowed to uniformly spread within a space between the surface of the electronic component 19 and the opposed surface 18 of the heat sink 14. An enough adsorption has been established between the surface of the electronic component 19 and the opposed surface 18 of the heat sink 14. The heat sink 14 is restrained from movement in the perpendicular direction PD. Even after the heat sink 14 is released from the predetermined urging force, the heat sink 14 is held on the electronic component 19.

Figure 5:
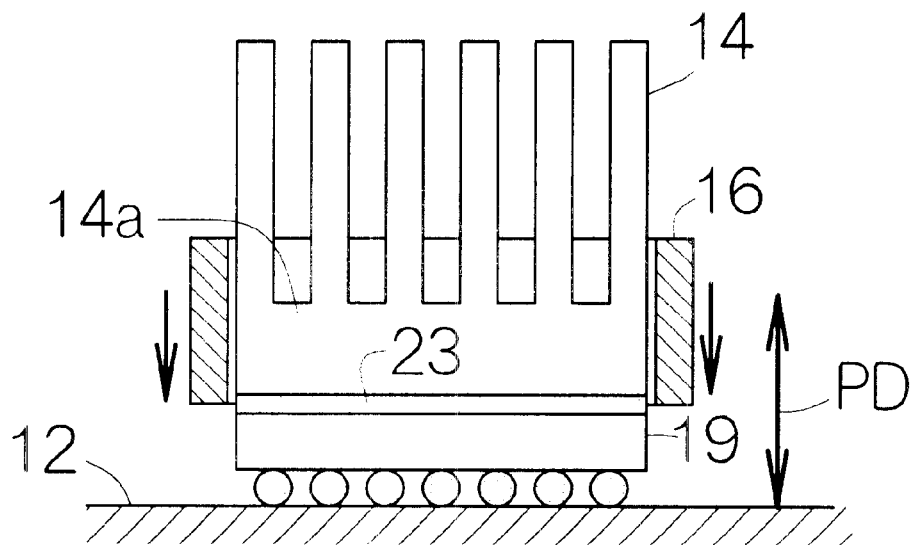
FIG. 5 is an enlarged partial vertical sectional view of the electronic circuit board for schematically illustrating the process of setting frame member on the heat sink and the electronic component.

When the mounting of the heat sink 14 has been completed in the aforementioned manner, as shown in FIG. 5, the frame member 16 is set around the heat sink 14 and the electronic component 19. The lower end of the frame member 16 is received on the surface of the printed wiring board 12. The mounting of the cooling device 13 has been completed in this manner.

Figure 6:
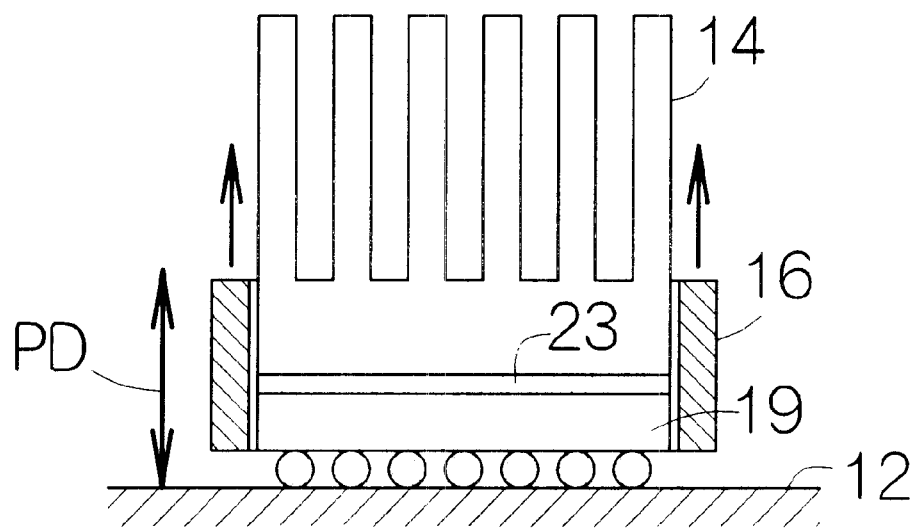
FIG. 6 is an enlarged partial vertical sectional view of the electronic circuit board for schematically illustrating the process of removing the frame member from the heat sink and the electronic component.
Figure 7:
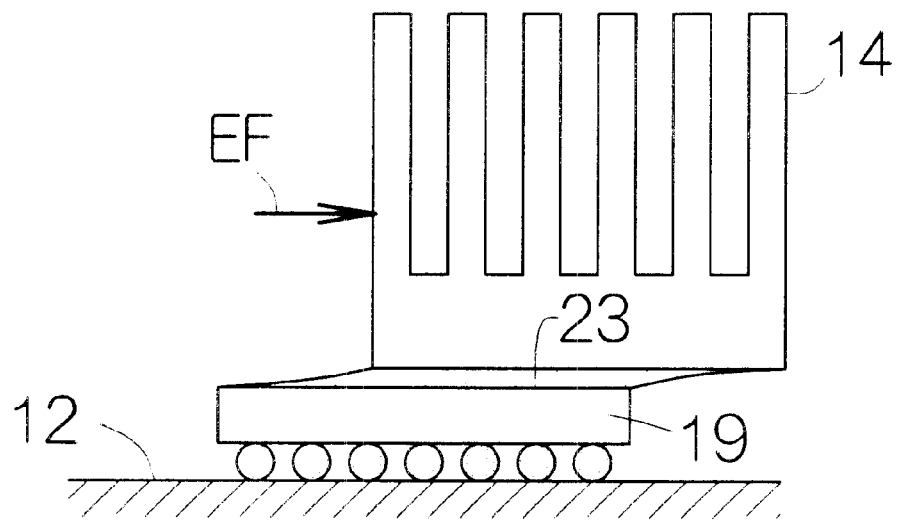
FIG. 7 is an enlarged partial vertical sectional view of the printed wiring board for schematically illustrating the process of taking off the heat sink from the electronic component.

When one intends to detach the cooling device 13, as shown in FIG. 6, the frame member 16 is removed from the printed wiring board 12. The frame member 16 can be lifted in the perpendicular direction PD. Thereafter, the external force EF is applied to the heat sink 14 in the horizontal direction, as shown in FIG. 7. The heat sink 14 is forced to easily slip along the surface of the electronic component 19. The heat sink 14 is allowed to easily take off from the surface of the electronic component 19 in this manner. The removal of the heat sink 14 has been completed.

Figure 8:
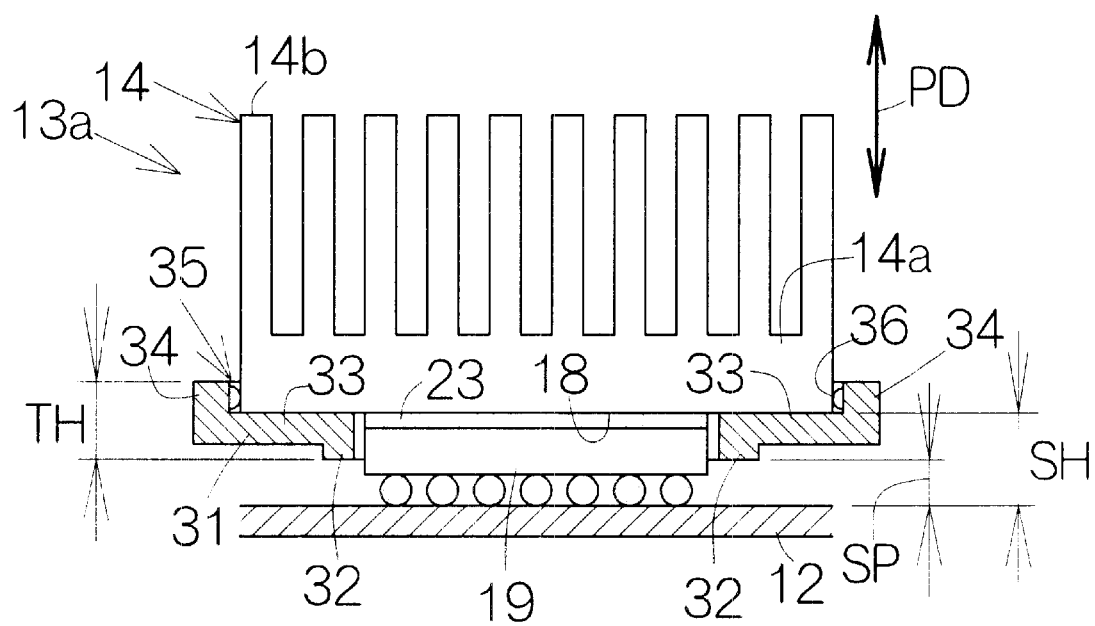
FIG. 8 is an enlarged partial vertical sectional view of the electronic circuit board for schematically illustrating a cooling device according to a second embodiment of the present invention.

FIG. 8 schematically illustrates a cooling device 13a according to a second embodiment of the present invention. The heat receiving plate 14a of the heat sink 14 is formed bigger than the surface of the electronic component 19 in this cooling device 13a. Accordingly, the opposed surface 18 of the heat receiving plate 14a is partially received on the surface of the electronic component 19. The thermal grease 23 is interposed between the surface of the electronic component 19 and the opposed surface 18 of the heat sink 14 in the aforementioned manner. The thermal grease 23 serves to enhance the contact between the electronic component 19 and the heat sink 14. The thermal grease 23 also serves to restrain the heat sink 14 from moving in the perpendicular direction PD perpendicular to the surface of the electronic component 19. The thermal grease 23 thus prevents the heat sink 14 from peeling off from the electronic component 14. Only the atmosphere pressure acts on the heat sink 14 so as to urge the heat sink 14 against the electronic component 19.

The cooling device 13a includes a frame member 31 surrounding the electronic component 19 and the heat receiving plate 14a of the heat sink 14. Four lower walls 32 are defined in the frame member 31. The lower walls 32 are continuously opposed to the periphery of the electronic component 19 at all directions. A horizontal wall 33 is connected to the upper ends of the lower walls 32. The horizontal wall 33 extends outward in the horizontal direction from the lower walls 32. The horizontal wall 33 is designed to get opposed to the opposed surface 18 of the heat sink 14. Four upper walls 34 are also defined in the frame member 31. The upper walls 34 are designed to stand upright from the upper surface of the horizontal wall 33 at the periphery of the horizontal wall 33. The upper walls 33 are continuously opposed to the periphery of the heat receiving plate 14a of the heat sink 14 at all directions. The frame member 31 may be molded out of a resin material, for example.

The frame member 31 is set around the heat sink 14. The frame member 31 is allowed to move in the perpendicular direction PD perpendicular to the surface of the electronic component 19. A displacement prevention mechanism 35 is established between the frame member 31 and the heat sink 14 in the same manner as described above. The displacement prevention mechanism 35 may comprise protrusions 36 formed on the inner surfaces of the upper walls 34 and depressions, not shown, formed on the outer surface of the heat sink 14, for example. The depressions are designed to receive the corresponding protrusions 36 when the frame member 31 takes a predetermined set position.

As is apparent from FIG. 8, when the frame member 31 is positioned at the predetermined set position, the frame member 31 is spaced from the surface of the printed wiring board 12. The frame member 31 at the predetermined set position is allowed to surround the heat sink 14 and the electronic component 19. A predetermined space SP can be established between the lower end of the frame member 31 and the surface of the printed wiring board 12. In this case, the overall height TH of the frame member 31 in the perpendicular direction PD is set smaller than the height SH measured between the surface of the printed wiring board 12 and the opposed surface 18 of the heat sink 14 in the perpendicular direction PD.

During transportation of the printed wiring board 12, for example, the heat sink 14 may slip along the surface of the electronic component 19 because of inclination or vibration of the printed wiring board 12. The frame member 31 is allowed to move along the surface of the printed wiring board 12 so as to follow the movement of the heat sink 14. The inner surface of the lower wall 32 is thereafter received on the periphery of the electronic component 19. The frame member 31 restrains the slippage of the heat sink 14 within a predetermined range in the same manner as described above. The thermal grease 23 keeps the adsorption acting between the surface of the electronic component 19 and the opposed surface 18 of the heat sink 14. The frame member 31 thus functions as a slippage prevention mechanism of the present invention.

Next, a brief description will be made on a method of attaching and detaching the cooling device 13a according to the second embodiment of the invention. In this second embodiment, the frame member 31 is set around the electronic component 19 on the printed wiring board 12 prior to the mounting of the heat sink 14. The lower end of the frame member 31 may be received on the surface of the printed wiring board 12. After the mounting of the frame member 31, the thermal grease 23 is supplied to the upper surface of the electronic component 19 in the same manner as described above.

The heat sink 14 is then mounted on the surface of the electronic component 19. The attitude of the heat sink 14 is set to correspond to that of the frame member 31. The heat sink 14 is then urged against the electronic component 19 on the printed wiring board 12 with a predetermined urging force. The thermal grease 23 is thus allowed to uniformly spread within a space between the surface of the electronic component 19 and the opposed surface 18 of the heat sink 14. An enough adsorption has been established between the surface of the electronic component 19 and the opposed surface 18 of the heat sink 14. Even after the heat sink 14 is released from the predetermined urging force, the heat sink 14 is held on the electronic component 19.

Subsequently, the frame member 31 is lifted above the surface of the printed wiring board 12. The movement of the frame member 31 is guided by the contour of the electronic component 19. When the upper surface of the horizontal wall 33 is received on the opposed surface 18 of the heat sink 14, for example, the protrusions 35 are received in the corresponding depressions in the displacement prevention mechanism 35. The frame member 31 is positioned at the predetermined set position in this manner. The elasticity of the frame member 31 itself serves to engage the frame member 31 with the heat sink 14. The heat receiving plate 14a of the heat sink 14 and the electronic component 19 are thus surrounded by the frame member 31. The mounting of the cooling device 13a has been completed.

Figure 9:
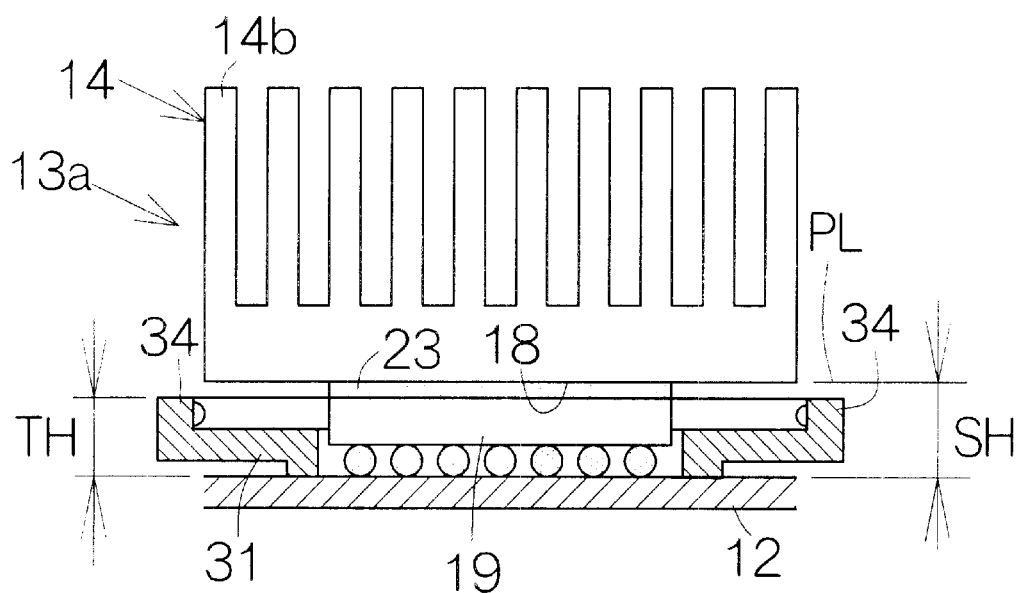
FIG. 9 is an enlarged partial vertical sectional view of the electronic circuit board for schematically illustrating the process of taking off the frame member from the heat sink.

When one intends to detach the cooling device 13a, as shown in FIG. 9, the frame member 31 is lowered toward the surface of the printed wiring board 12. When the lower end of the frame member 31 has been received on the surface of the printed wiring board 12, the upper walls 34 of the frame member 31 are allowed to take off from the heat sink 14. Since the height TH of the frame member 31 is set smaller than the height SH between the surface of the printed wiring board 12 and the opposed surface 18 of the heat sink 14 in the aforementioned manner, the upper end of the frame member 31 is reliably positioned below a plane PL including the opposed surface 18 of the heat receiving plate 14a.

Figure 10:
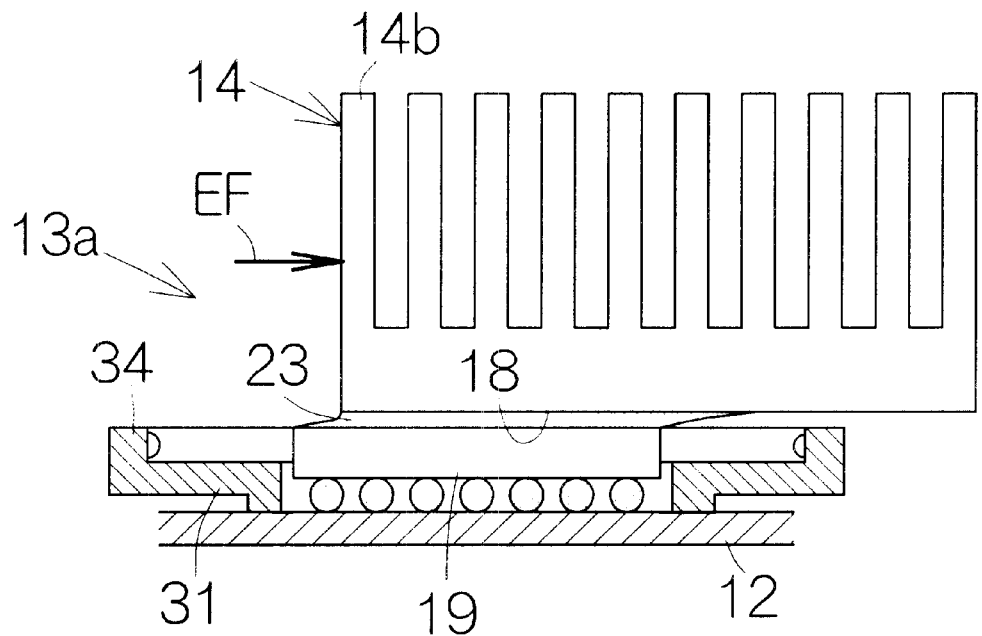
FIG. 10 is an enlarged partial vertical sectional view of the printed wiring board for schematically illustrating the process of taking off the heat sink from the electronic component.

In this situation, the external force EF is applied to the heat sink 14 in the horizontal direction, as shown in FIG. 10. The heat sink 14 is forced to easily slip along the surface of the electronic component 19 without contacting the frame member 31. The heat sink 14 is allowed to easily take off from the surface of the electronic component 19 in this manner. The removal of the heat sink 14 has been completed.

Figure 11:
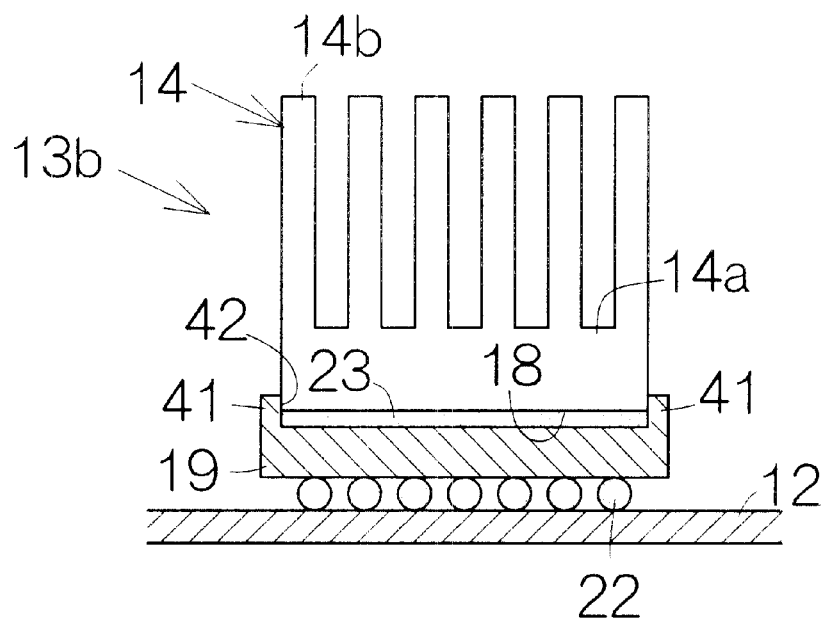
FIG. 11 is an enlarged partial vertical sectional view of the electronic circuit board for schematically illustrating a cooling device according to a third embodiment of the present invention.

FIG. 11 schematically illustrates a cooling device 13b according to a third embodiment of the present invention. The cooling device 13b of the third embodiment includes, in place of the frame member 16, 31, four protrusions 41 standing on the surface of the electronic component 19. The protrusions 41 are continuously opposed to the periphery of the heat sink 14 at all directions. Spaces are defined between the protrusions 41 and the heat sink 14. The protrusions 41 may be formed integral to the electronic component 19, for example. The adjacent protrusions 41 may be connected to each other. If all the protrusions 41 are connected in this manner, a depression 42 can be defined on the upper surface of the electronic component 19 for receiving the heat receiving plate 14a of the heat sink 14. The protrusions 41 are allowed to continuously surround the heat sink 14. In FIG. 11, like reference characters or numerals are attached to the structure or components equivalent to those of the aforementioned first and second embodiments.

During transportation of the printed wiring board 12, for example, the heat sink 14 may slip along the surface of the electronic component 19 because of inclination or vibration of the printed wiring board 12. The protrusions 41 on the electronic component 19 are allowed to engage the heat sink 14. The protrusions 41 serve to restrain the slippage of the heat sink 14 within a predetermined range in the same manner as described above. The protrusions 41 thus function as a slippage prevention mechanism of the present invention.

Figure 12:
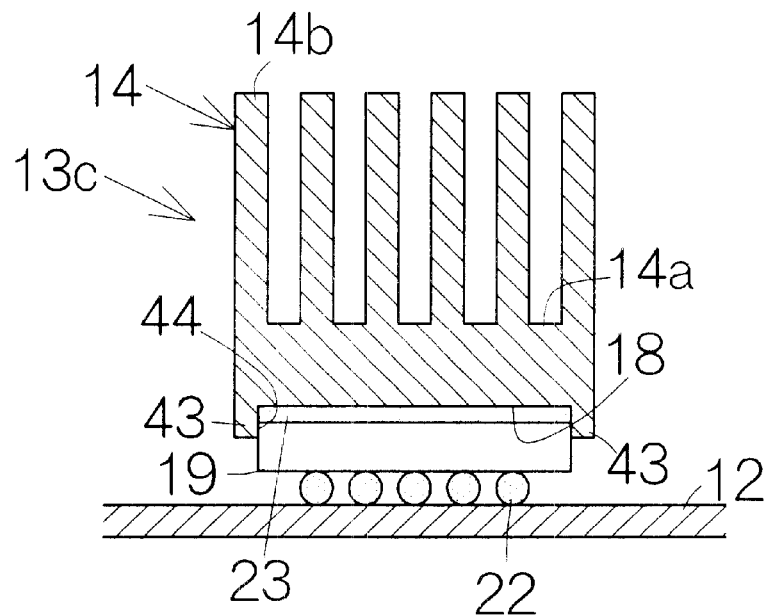
FIG. 12 is an enlarged partial vertical sectional view of the electronic circuit board for schematically illustrating a cooling device according to a fourth embodiment of the present invention.

FIG. 12 schematically illustrates a cooling device 13c according to a fourth embodiment of the present invention. The cooling device 13c of the fourth embodiment includes, in place of the frame member 16, 31, four protrusions 43 standing on the opposed surface 18 of the heat sink 14. The protrusions 43 are continuously opposed to the periphery of the electronic component 19 at all directions. Spaces are defined between the protrusions 43 and the electronic component 19. The protrusions 43 may be formed integral to the heat sink 14, for example. The adjacent protrusions 43 may be connected to each other. If all the protrusions 43 are connected in this manner, a depression 44 can be defined on the opposed surface 18 of the heat sink 14 for receiving the electronic component 19. The protrusions 43 are allowed to continuously surround the electronic component 19. In FIG. 12, like reference characters or numerals are attached to the structure or components equivalent to those of the aforementioned first and second embodiments.

During transportation of the printed wiring board 12, for example, the heat sink 14 may slip along the surface of the electronic component 19 because of inclination or vibration of the printed wiring board 12. The protrusions 43 on the heat sink 14 are allowed to engage the electronic component 19. The protrusions 43 serve to restrain the slippage of the heat sink 14 within a predetermined range in the same manner as described above. The protrusions 43 thus function as a slippage prevention mechanism of the present invention.

Figure 13:
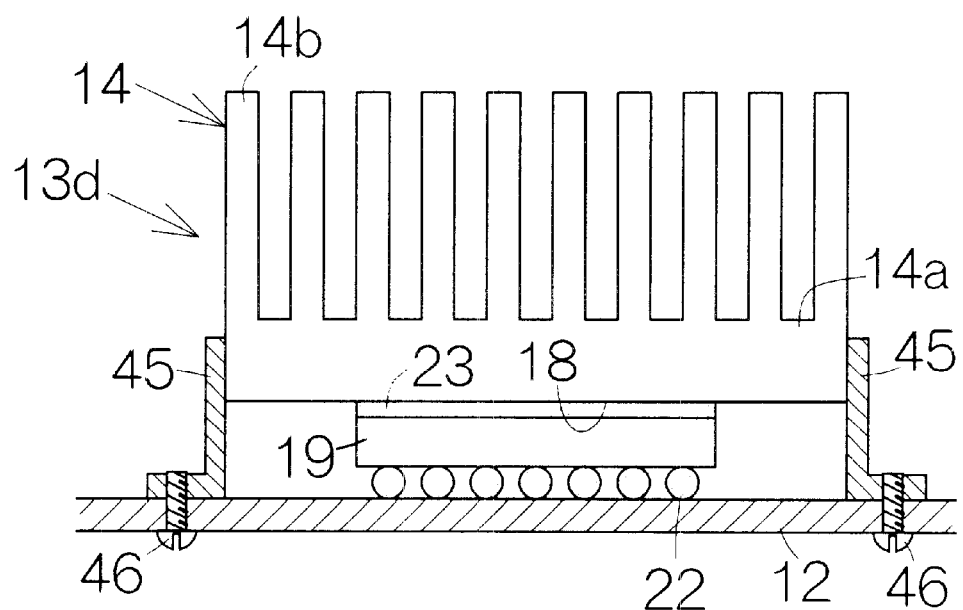
FIG. 13 is an enlarged partial vertical sectional view of the electronic circuit board f or schematically illustrating a cooling device according to a fifth embodiment of the present invention.

FIG. 13 schematically illustrates a cooling device 13d according to a fifth embodiment of the present invention. The cooling device 13d of the fifth embodiment includes, in place of the frame member 16, 31, four protrusions 45 standing on the upper surface of the printed wiring board 12. The protrusions 45 are continuously opposed to the periphery of the heat sink 14 at all directions. Spaces are defined between the protrusions 45 and the heat sink 14. The protrusions 45 may be fixed to the printed wiring board 12, for example. Any coupling means such as screws 46 may be employed to fix the protrusions 45 on the printed wiring board 12. The adjacent protrusions 45 may be connected to each other. If all the protrusions 45 are connected in this manner, a frame can be formed to surround the heat receiving plate 14a of the heat sink 14 and the electronic component 19. The protrusions 45 are allowed to continuously surround the heat sink 14. In FIG. 13, like reference characters or numerals are attached to the structure or components equivalent to those of the aforementioned first and second embodiments.

During transportation of the printed wiring board 12, for example, the heat sink 14 may slip along the surface of the electronic component 19 because of inclination or vibration of the printed wiring board 12. The protrusions 45 on the printed wiring board 12 are allowed to engage the heat sink 14. The protrusions 45 serve to restrain the slippage of the heat sink 14 within a predetermined range in the same manner as described above. The protrusions 45 thus function as a slippage prevention mechanism of the present invention.

Figure 14:
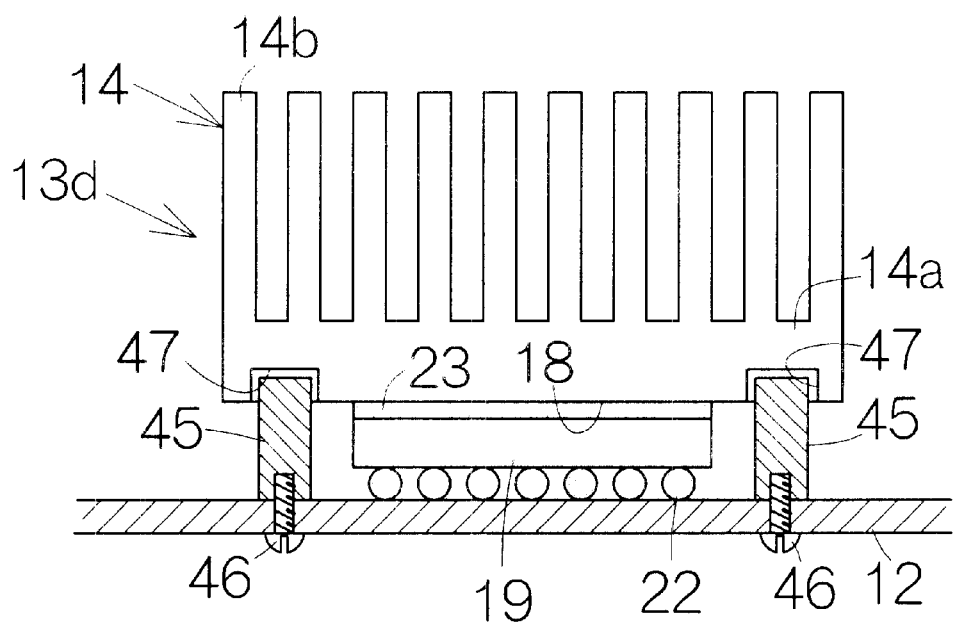
FIG. 14 is an enlarged partial vertical sectional view of the electronic circuit board for schematically illustrating a cooling device according to a modification of the fifth embodiment.

As is apparent from FIG. 14, grooves 47 may be formed on the opposed surface 18 of the heat sink 14 so as to receive the corresponding protrusions 45 on the printed wiring board 12. When the heat sink 14 slips along the surface of the electronic component 19, the protrusions 45 are allowed to engage the corresponding grooves 47. The cooperation of the protrusions 45 and the grooves 47 thus serves to restrain the slippage of the heat sink 14 within a predetermined range in the same manner as described above.

In this case, metallic stiffeners can be employed as the protrusions 45 on the printed wiring board 12. The metallic stiffeners are usually attached to the printed wiring board 12 so as to reinforce the rigidity of the printed wiring board 12. The stiffeners may be provided to surround the electronic component 19. Twist or deformation can thus be suppressed in the printed wiring board 12 in the vicinity of the electronic component 19.

Figure 15:
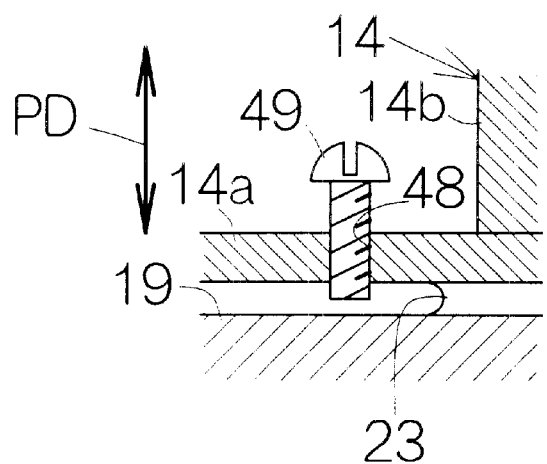
FIG. 15 is an enlarged partial vertical sectional view of the electronic component and the heat sink for schematically illustrating the structure of an example of a peeling mechanism.

In the aforementioned cooling devices 13, 13a–13d, a peeling mechanism may be established between the heat sink 14 and the electronic component 19, for example. The peeling mechanism may include a screw bore 48 formed in the heat receiving plate 14a of the heat sink 14 and a screw 49 screwed in the screw bore 48, as shown in FIG. 15, for example. When one intends to attach the heat sink 14, the screw 49 is held at an inoperative position. The leading end of the screw 49 at the inoperative position is simply opposed to the surface of the electronic component 19. The head of the screw 49 is spaced from the surface of the heat sink 14. When one intends to detach the heat sink 14, the screw 49 is screwed deep into the screw bore 48. The leading end of the screw 49 is received on the surface of the electronic component 19. A further advancement of the screw 49 into the screw bore 48 enables to convert the rotational force of the screw 49 to the thrust force in the perpendicular direction PD. The heat sink 14 can be peeled off from the surface of the electronic component 19 irrespective of the adsorption of the thermal grease 23 between the heat sink 14 and the electronic component 19.

It should be noted that the inner surfaces of the frame members 16, 31 as well as the protrusions 41, 43, 45 may completely contact the periphery of the electronic component 19 as well as the heat sink 14. In these cases, the slippage of the heat sink 14 is completely prevented.

What is claimed is:

1. A cooling device comprising:
    a heat radiation member received on a surface of a target member at an opposed surface of the heat radiation member;
    a heat conductive fluid interposed between the surface of the target member and the opposed surface of the heat radiation member, said heat radiation member being held on the target member without being mechanically engaged with the target member in a first direction perpendicular to the surface of the target member; and
    a slippage prevention mechanism engaging the heat radiation member in a second direction along the surface of the target member such that it restrains slippage of the heat radiation member along the surface of the target member.

2. The cooling device according to claim 1, wherein said slippage prevention mechanism comprises a frame member surrounding the target member and the heat radiation member.

3. The cooling device according to claim 2, wherein said heat conductive fluid includes at least either of ceramic particles or metallic particles.

4. The cooling device according to claim 3, wherein said particles are dispersed in a grease.

5. The cooling device according to claim 4, wherein said slippage prevention mechanism regulates an extent of the slippage.

6. The cooling device according to claim 5, wherein said heat radiation member comprises a fin standing in the perpendicular direction.

7. The cooling device according to claim 1, wherein said slippage prevention mechanism comprises a protrusion formed on the target member, said protrusion engaging the heat radiation member when the heat radiation member slips along the surface of the target member.

8. The cooling device according to claim 7, wherein said heat conductive fluid includes at least either of ceramic particles or metallic particles.

9. The cooling device according to claim 8, wherein said particles are dispersed in a grease.

10. The cooling device according to claim 9, wherein said slippage prevention mechanism regulates an extent of the slippage.

11. The cooling device according to claim 1, wherein said slippage prevention mechanism comprises:
    a support member fixedly supporting the target member; and
    a protrusion fixedly located on the support member and engaging the heat radiation member when the heat radiation member slips along the surface of the target member.

12. The cooling device according to claim 11, wherein said heat conductive fluid includes at least either of ceramic particles or metallic particles.

13. The cooling device according to claim 12, wherein said particles are dispersed in a grease.

14. The cooling device according to claim 13, wherein said slippage prevention mechanism regulates an extent of the slippage.

15. The cooling device according to claim 14, wherein said heat radiation member comprises a fin standing in the perpendicular direction.

16. The cooling device according to claim 15, wherein said support member is detachably connected to a substrate for receiving the target member.

17. A cooling device comprising:
    a heat radiation member received on a surface of a target member at an opposed surface of the heat radiation member;
    a heat conductive fluid interposed between the surface of the target member and the opposed surface of the heat radiation member, said heat radiation member being held on the target member without being mechanically engaged with the target member in a first direction perpendicular to the surface of the target member; and
    a protrusion formed on the heat radiation member and engaging the target member in a second direction along the surface of the target member such that it restrains slippage of the heat radiation member along the surface of the target member.

18. The cooling device according to claim 17, wherein said heat conductive fluid includes at least either of ceramic particles or metallic particles.

19. The cooling device according to claim 18, wherein said particles are dispersed in a grease.

20. The cooling device according to claim 19, wherein said slippage prevention mechanism regulates an extent of the slippage.

* * * * *